United States Patent
Zaidel et al.

[11] Patent Number: 5,408,742
[45] Date of Patent: Apr. 25, 1995

[54] PROCESS FOR MAKING AIR BRIDGES FOR INTEGRATED CIRCUITS

[75] Inventors: Simon A. Zaidel, Manlius; Terrence S. Alcorn; William F. Kopp, both of Liverpool; George C. Pifer, North Syracuse, all of N.Y.

[73] Assignee: Martin Marietta Corporation, Syracuse, N.Y.

[21] Appl. No.: 141,474

[22] Filed: Oct. 22, 1993

Related U.S. Application Data

[62] Division of Ser. No. 783,745, Oct. 28, 1991, abandoned.

[51] Int. Cl.$^6$ .............................. H05K 3/02
[52] U.S. Cl. .................. 29/846; 156/630; 156/631; 156/902
[58] Field of Search .......... 29/827, 846; 156/631, 156/638, 901, 902, 630

[56] References Cited

U.S. PATENT DOCUMENTS

| | | | |
|---|---|---|---|
| 3,461,524 | 8/1969 | Lepselter. | |
| 3,597,839 | 8/1971 | Jaccodine. | |
| 3,693,251 | 9/1972 | Jacodine | 29/827 X |
| 3,740,819 | 6/1973 | Babusci et al. | 29/827 |
| 3,816,195 | 6/1974 | Hebenstreit | 156/631 |
| 4,118,595 | 10/1978 | Pfahnl et al. | |
| 4,436,766 | 3/1984 | Williams. | |
| 5,113,580 | 5/1992 | Schroeder et al. | 29/827 |

*Primary Examiner*—Carl J. Arbes
*Attorney, Agent, or Firm*—Paul Checkovitch; Stephen A. Young

[57] ABSTRACT

The invention relates to an air bridge and an evaporative process for making air bridges. A first layer of photoresist is patterned to create two openings over the contacts to be connected, separated by a strip of photoresist. The photoresist strip is hard baked to allow it to soften and to cause further cross linking. The softening allows surface tension to reshape the photoresist strip to create a gradually sloping arcuate surface between contact openings upon which a metal layer of nearly constant thickness may be evaporated. A second layer of photoresist is then applied, and patterned to create a single large opening embracing both contacts and the now arcuate hard baked photoresist strip. An arch within the large opening connecting both contacts is formed by evaporation. Excess metal and both photoresist layers are then removed, leaving a novel, arch shaped air bridge.

1 Claim, 3 Drawing Sheets

PROCESS FOR MAKING AIR BRIDGES FOR INTEGRATED CIRCUITS

This application is a division of application Ser. No. 07/783,745, filed Oct. 28, 1991, now abandoned.

BACKGROUND OF THE INVENTION

1. Field of the Invention

The invention relates to monolithically integrated circuits, and more particularly to an air bridge which interconnects certain conductors on an integrated circuit, while crossing over others. The invention also relates to a photolithographic process incorporating an evaporation step to form an air bridge suitable for monolithically integrated circuits.

2. Prior Art

Air bridges provide a choice to the designers of monolithic integrated circuits, who in laying out point to point circuit runs, find it necessary to continue a conductive path to another point on a chip, which cannot be reached without crossing other conductors.

A second choice is to add another dielectric layer, another metallization, and via holes to get from the original metallization to the second metallization.

The solution of another dielectrically supported metallization is not always the better choice, particularly for circuits carrying radio frequency energy. The dielectric layer increases the capacitive coupling between the overlapping conductors, and may add to losses in r.f. propagation. The air bridge, on the other hand, provides a simple technique for cross overs where they are needed, and as the name implies, it is constructed to have only an air dielectric between the overlapping conductors.

The air bridge solution requires additional process steps and should avoid the danger of contaminating the existing integrated circuit. The conventional air bridge approach is to use photolithographic processing, including a sputtering and an electroplating step. The conventional process requires a large processing time, has the potential for contaminating the surfaces with the wet chemicals used in electroplating. The electroplating is not accurate and usually requires ion milling to define the critical features. The ion milling produces stringers which if not carefully removed, may cause circuit failure.

An evaporative process is preferable in these respects, and the present invention is of this nature.

SUMMARY OF THE INVENTION

These and other objectives are achieved in accordance with the present invention by a novel air bridge which interconnects two mutually spaced contacts on the surface of a semiconductor body and by a novel method of making this air bridge. The novel method is suitable for processing one or more wafers each containing a plurality of chips in a single batch.

The present novel method of making an air bridge entails photolithographically patterning a first photoresist layer on each wafer to create two openings with relatively steep sides between which a photoresist strip of uniform thickness is disposed. The photoresist is then heated to cause momentary softening of the photoresist, which allows surface tension forces to reshape the strip. The slopes of photoresist near the opening are reduced and a gradually curving arcuate profile between contacts is created. The heating also cross-links the photoresist increasing its resistance to photoresist solvent, to the developers, and reduces its sensitivity to illumination.

A second layer of photoresist with a contrast enhancement layer is next applied and photolithographically patterned to create a single third opening over the two prior openings and over the intermediate strip of hard baked photoresist, now used to define the undersurface of the arch of the air bridge.

The wafer is next placed in an evaporator where a gold titanium layer is evaporated over the wafer, plating the area within the third opening to form a metallic arch interconnecting the two contacts.

The wafer is next treated with acetone, so as to remove both the second layer of photoresist and the polymerized first layer of photoresist. The surrounding metallization is also stripped off, separation being aided by a CEM layer, which permits its removal without injury to the air bridge metallization.

The novel process is readily performed for a large number of air bridges on a large number of chips in a single batch. The process is much shorter than the conventional electroplating method, and the resulting air bridge has excellent mechanical and electrical properties.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
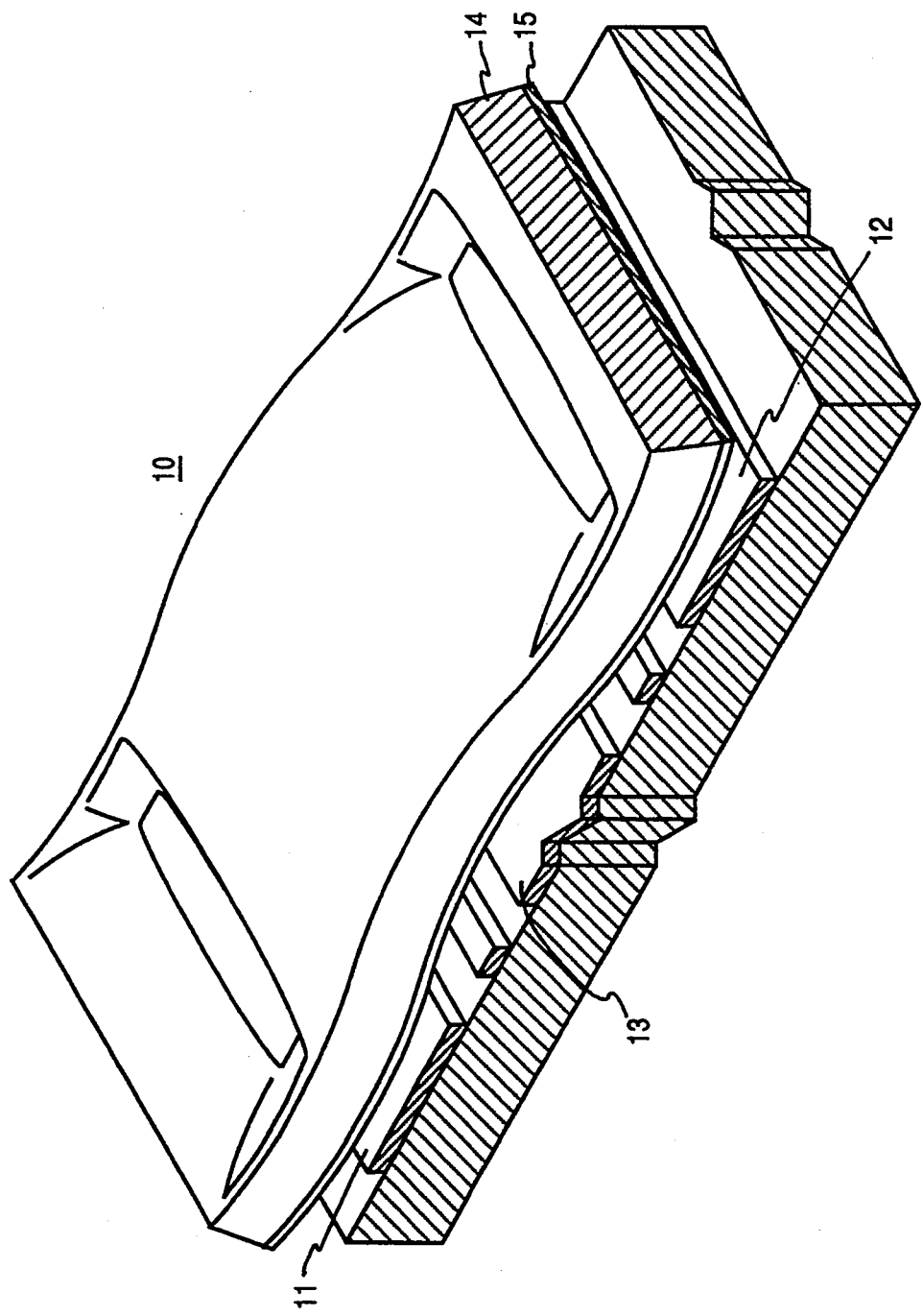
FIG. 1 is a perspective view of a novel air bridge for interconnecting two spaced contacts on a semiconductor chip.

A novel air bridge for electrically interconnecting two spaced contacts on a semiconductor body is illustrated in FIG. 1.

The air bridge of FIG. 1 consists of an arch 10 of evaporated metal making electrical contact with two metallized conductor runs 11, 12. The conductor runs, which also provide mechanical support for the arch, are formed on the upper surface of a semiconductor substrate. A third conductor run 13, located between conductor runs 11 and 12 and lying beneath the arch, is neither in mechanical nor electrical contact with the arch. The air bridge thus provides a means for maintaining an air insulated relationship between crossing conduction runs, while both derive support from a common surface.

The arch 10 consists of a gold layer (14) having a nearly uniform thickness of 2.0 microns, with a thinner layer (15) of titanium having a thickness of 0.05, microns beneath, both formed by evaporation. The titanium is used to improve the bond between the arch and the conductor runs. The "rise" dimension at the center of the arch is slightly under 3 microns. The rise dimension of the arch is largely independent of the length or breadth of the air bridge, and being batch processed, is process dependent.

The bridge, illustrated in FIG. 1, makes contact between two spaced transversely oriented conductor runs. It may, of course, be used to make a series of connections, during which it passes over some conductor runs and contacts others. The air bridge may thus be used to provide DC biases or high frequency signals to a succession of nodes in a monolithic microwave integrated circuit (MMIC). On a finer scale, it may also be used to provide the manifolds for transistors of an interdigitated design, in which it may be used to connect the source fingers together while passing over gates and drains, or to connect the drains together while passing over the sources and gates, etc.

FIGS. 2A-2H illustrate successive stages in the process of making an air bridge similar to the one illustrated in FIG. 1, but used in interconnecting the fingers of an interdigitated field effect transistor. In this application, the air bridge of FIGS. 2A-2H is smaller than the air bridge of FIG. 1 in length and breadth, but has the same rise dimension and metallization thickness.

Figure 2A:
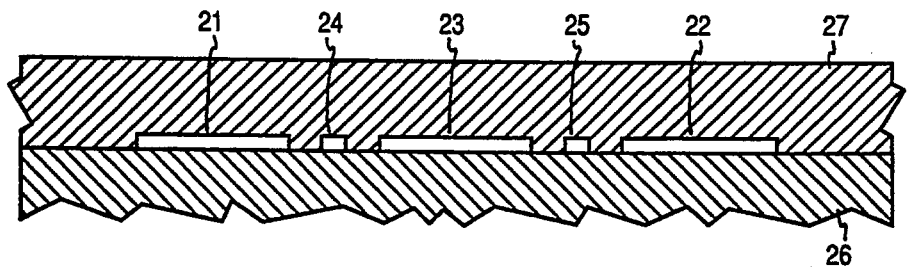
FIGS. 2A–2H are elevation views, illustrating successive stages in the process of making an air bridge similar to the one shown in FIG. 1, but used to interconnect the fingers of an interdigitated field effect transistor.
Figure 2B:
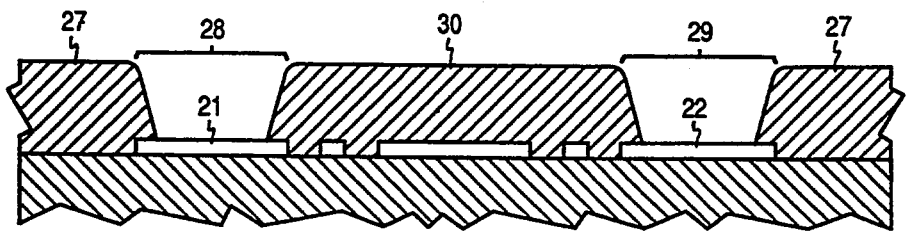
Figure 2C:
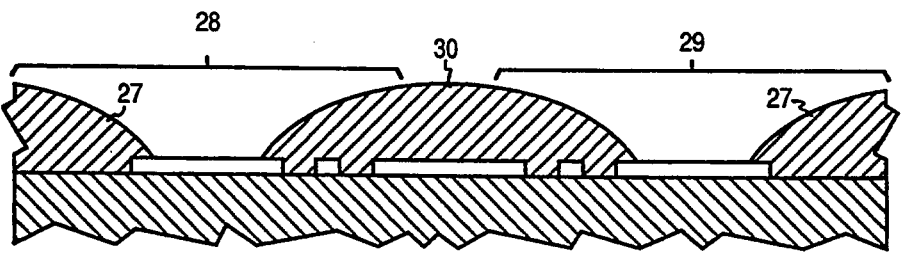
Figure 2D:
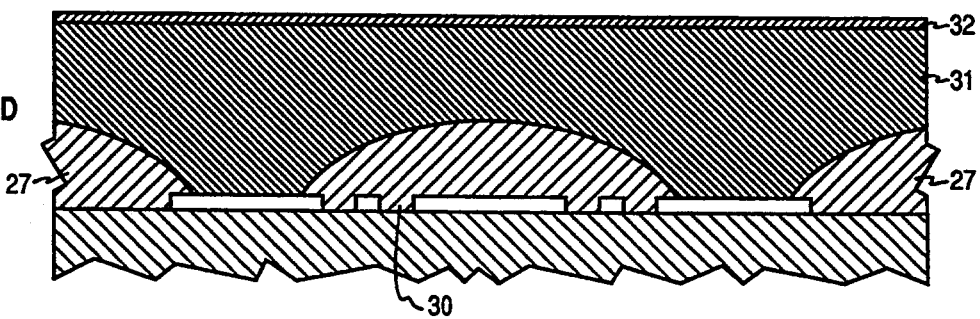
Figure 2E:
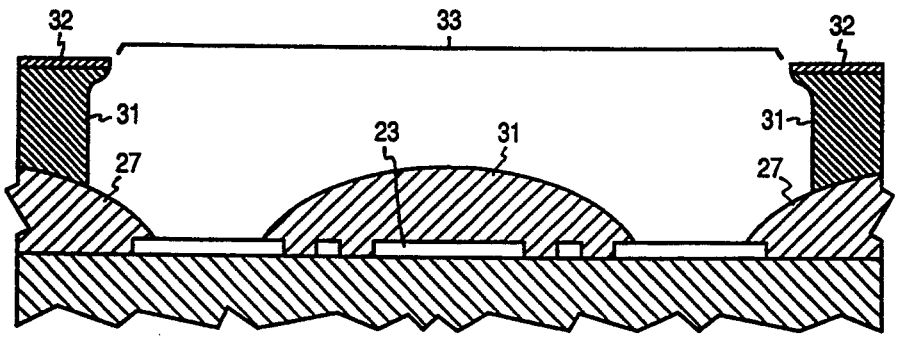
Figure 2F:
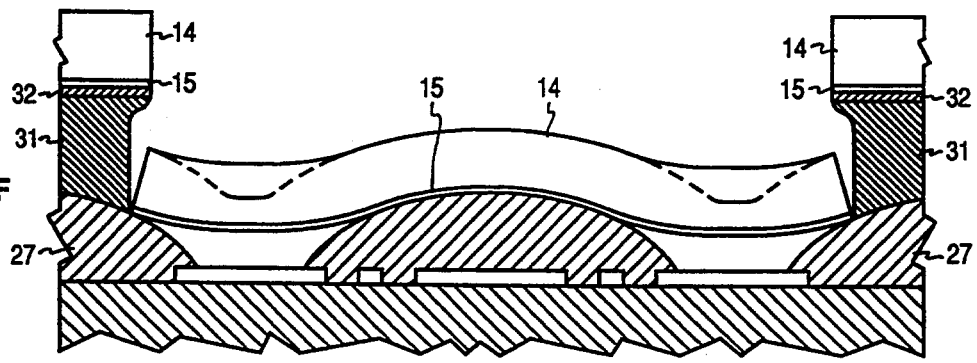
Figure 2G:
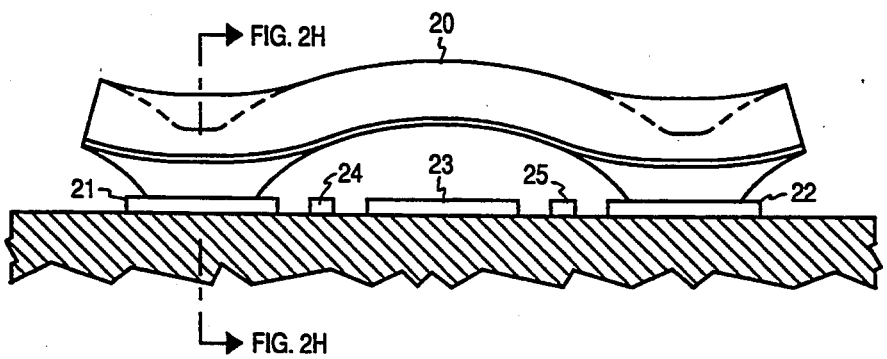

The air bridge 20 of FIG. 2G, which illustrates the final product of the process, interconnects two source fingers 21, 22 symmetrically arranged about a central drain finger 23 of an interdigitated field effect transistor. Gate fingers 24 and 25 are placed to either side of the drain.

Figure 2H:
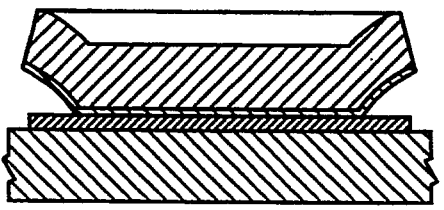

The air bridge of FIG. 2G has a free span of approximately 11 microns and a breadth measured across the span of approximately 11 microns. The thickness of the metallic arch is approximately 2 microns and the rise of the arch is approximately 3 microns above the semiconductor surface. A section of the arch taken along the center line of the bridge is arcuate to the center of the source fingers (21, 22) and curves upward past the center as shown by the dotted lines of FIG. 2G. A section view taken in a plane orthogonal to the axis through a source contact is provided in FIG. 2H. FIG. 2H shows a generally flat upper surface curving upward at either end.

The illustrated bridge except for the fingers 21-25, which are of exaggerated thickness, is approximately to scale. For a larger bridge, given the same thickness of photoresist, the edge effects remain of constant size, but become smaller in relation to the major portions of the metallization. A section of the bridge taken along the axis, with minor edge effects, becomes a substantially smooth, uninflected curve and is substantially arcuate.

A cross section of the bridge, taken at the center of the span is substantially rectangular, with the outer edges inclined inward due to the overhang of the mask used to define the boundaries of the bridge during evaporation. A cross section of the span taken nearer to the source contacts shows the more pronounced edge effects of FIG. 2H. When the breadth of the bridge is increased, the edge effects, more prominent near the source contacts, remain of constant size, and smaller in relation to the major portion of the span cross section. The span cross section, with localized edge effects, is substantially rectangular.

Air bridges, for practical reasons, must be made by a batch process and still be able to accommodate varying point to point circuit requirements. All of the air bridges on a single chip and all of the air bridges on a common wafer are processed in a single batch. Preferably, all of the air bridges on a number of wafers are processed in the same batch.

The air bridges, to which the invention relates, while batch processed, can readily accommodate varying circuit requirements. Batch processing leads to equal rise dimensions and equal metallization thicknesses for the air bridge. As a more detailed explanation of the novel process will show, a thermally softened photoresist allowed to deform under surface tension forces, and then allowed to harden, becomes the form for subsequent deposition of the air bridge metallization. The softening process produces arcuate surfaces, having a maximum thickness, fixed to be slightly less than the original thickness of the photoresist. Thus, all air bridges which are formed by thermally reshaping photoresist layers of the same thickness will have the same rise dimension. Similarly, all metal depositions carried out simultaneously in forming the air bridge will be of the same thickness.

Constancy in the rise and thickness dimensions of the arch provides adequate design flexibility. A convenient "rise" dimension for the arch of the air bridge, measured at the center of the free span, is approximately 3 microns. This corresponds to the thickness of photoresist that can be patterned to achieve a 1 to 1½ microns feature resolution. This rise provides a reasonable range of electrical transmission line impedances with reasonable selections for the breadth dimension. The design thickness of the metallization is normally determined by the skin effect for propagating radio frequency waves at the frequency in question. The skin effect determines the thickness of the metallization which contributes to radio frequency propagation, and indicates when the thickness is unnecessarily large. Avoiding unnecessary thickness shortens the evaporation time and reduces gold consumption and is therefor desirable.

An air bridge with fixed selections for the rise dimension and metallization thickness still permits good circuit optimization. The air bridges may have a smaller surface area or a much larger surface area than the air bridge shown in FIG. 2G and they may vary in both span and breadth to meet circuit needs. The free span of the air bridge may be variable to accommodate point to point connections at random positions on the chip and to cross over varying numbers of conductor runs. The breadth of the air bridge may be varied to accommodate required current carrying capacities or required transmission line impedances.

The major stages in a novel process of making the air bridge are illustrated in FIGS. 2A-2H, FIGS. 2G and 2H illustrating the final product.

In FIG. 2A, a small portion of a semiconductor chip 26 associated with a portion of an interdigitated semiconductor device is shown in side elevation. The remainder of the chip may contain a monolithic microwave integrated circuit or other active devices performing digital or analog circuit functions. At this stage of assembly, the principal semiconductor devices in the chip have been formed, usually including a final pacification layer and the exposed metallizations 21 to 25, which contact the underlying regions, are ready for the application of manifolding connections and external connections to other points in the associated circuit.

In the illustrated arrangement, the source fingers 21 and 22, are to be joined by the air bridge, where the processing of which will now be described.

As a first step in the process of forming an air bridge, the semiconductor chip is coated with a first layer 27 of photoresist. The photoresist is applied to a thickness of approximately 3 microns.

The photoresist, for example, may be Shipley AZ6220 photoresist. It is applied to the wafer and spread by a short duration, slow spin, typically five seconds at 500 RPM, followed by a fast spin of 5000 RPMs for 25 seconds. The photoresist 27 is then baked at a temperature of 90° C. for 45 seconds to drive off solvent and solidify the photoresist.

The wafer is now ready for patterning. It is exposed for 250 milli-seconds using conventional UV illumination. The pattern is designed to create two rectangular openings over the source contacts. The exposed photoresist is then developed with a Shipley AZ400K developer. It is applied to the wafer and spun at 600 RPM for two minutes. After development, the sides of the openings 28, 29 are nearly vertical and the footprint on the contacts 21 and 22 lies within the contacts and does not extend beyond, as pictured in FIG. 2B. Thus a strip 30 of photoresist is created, with the openings 28 and 29 set at either end defining the future site of the air bridge. The strip 30 is bounded on both sides with unpatterned portions of the photoresist layer (27).

The photoresist strip 30 is then subjected to a hard bake at 160° C. for 120 seconds. The effect upon its profile is illustrated in FIG. 2C. It may be seen that the slope of the strip near the contacts is no longer nearly vertical (as shown in FIG. 2B), but has assumed a more gradual slope, which becomes more gradual as one moves midway between the contacts, where it becomes horizontal.

The arch like strip 30 defines the under surface of the air bridge in a subsequent process step. The height of the arch midway between the contacts is slightly less than the original thickness of the photoresist in part as a result of loss of solvent. The reshaping that has taken place is the result of surface tension forces which act within the photoresist when its temperature is elevated to the point where melting occurs. The upper surface of the strip 29 is accordingly convex from contact to contact like a water droplet on a dry surface. The heating has further polymerized the photoresist thus making it less subject to solution by the solvents present in the photoresist and less subject to development by the developer. The heating has also made it less sensitive to illumination.

The substrate is next recoated with a second layer 31 of photoresist having a contrast enhancement material 32 applied to its upper surface. The second photoresist layer 31 may be of the same material used for the first layer 27 and may be applied in the same manner. The application of the second photoresist layer is designed to provide a uniform coating over the hard baked photoresist layer and to fill all of the openings.

After the second photoresist is baked at 90° C. for 45 seconds to drive off solvents, the contrast enhancement material (CEM) is applied in a thin layer 32 over the top of the second photoresist layer. The contrast enhancement material is applied in two parts. The first part is Hunts BC5 CEM applied and spun at 400 RPM for ten seconds. This is followed by Hunts 420 CEM, which is applied and spun at 400 RPM for seven seconds and then spun at 3000 RPM for 25 seconds. The CEM layer 32 forms a thin (<0.6 micron) uniform coating on the second photoresist layer 31. Other CEM layers may be used for this purpose.

The second photoresist layer 31 and contrast enhancement layer 32 are then exposed for 575 milliseconds to illumination patterned to form a single rectangular opening for the future site of the air bridge. The rectangular opening includes both contact openings 28 and 29 and the arcuate hard baked photoresist strip 30 defined between these openings.

After exposure, the CEM layer 32 is stripped off. The CEM "strip" uses a coating of SA-15 allowed to set for one minute, and then spun at 4000 RPM for ten seconds. The photoresist layer 31 is next developed with Shipley AZ400K (as before).

After development, the site for the air bridge is as shown in FIG. 2E. The photoresist developer has created an opening 33 approximately 6 microns deep at the deepest points and 3 microns deep where the hard baked photoresist strip 30 is highest, and approximately 24 microns long. The plan view of the opening, in the example, is rectangular. The opening 33 exposes the areas over the contacts 21, 22, originally uncovered by the openings 28 and 29 in the first photoresist layer 31, as well as the hard baked photoresist strip between each opening. There is also a band 1 to 2 microns wide surrounding each contact opening to allow for alignment errors.

At the top of the opening 33, the CEM layer 32 has created a small lip, which will be useful in separating the unwanted metal evaporated outside the opening, without damage to the metal within the opening, forming the air bridge.

After cleaning in a plasma reactor, the wafer is ready for deposition of the metal forming the air bridge. The wafer is loaded into a metal evaporator, set to evaporate titanium to a designated thickness of 500 Å followed by gold, set to attain a design thickness of 20,000 Å (2 microns).

In the evaporator, the wafers are oriented in a plane normal to the line of sight from the metallic source. In addition, while the wafers may rotate within the evaporator, the normal orientation is still preserved. The orientation may change slightly over the surface of the wafer, or with rotation. The lip on the mask from CEM layer 32 overlaying the vertical walls of the opening 33 in the photoresist layer 31, is designed to create a discontinuity between the metallization within the mask opening and that outside the opening so that the latter may be stripped without tearing the former.

The evaporated metallization is depicted in a side elevation view of FIG. 2F. The two metallizations 14, 15 coat the flat upper surface of the undeveloped second photoresist and CEM layers 31, 32 surrounding the opening 33, and the floor of the opening. Within the opening, the titanium layer 15 coats all of the surfaces at its bottom including the contacts 21, 22, and exposed portions of the hard baked photoresist. The exposed portions include a bowl shaped, convex upward, opening around each contact and the arcuate shaped strip between contacts, mentioned earlier.

The evaporated gold layers within the opening 33 is of nearly constant thickness replicating the bottom of opening except at the edges where the overhang produced by the CEM material causes a slight inward slope.

The wafer is now ready for lift off of the unwanted gold, and removal of both the hard baked photoresist layer 30 and the layers 31 and 32. The lift off is accomplished with acetone, which dissolves all three materials. A wash with methanol completes the process.

The final air bridge is shown in FIGS. 2G and 2H with all photoresist removed, including the hard baked photoresist defining the under surface of the arch.

The footprints of the arch are set within the contact strips 21 and 22, by a sufficient amount to avoid shorting to the substrate. The maximum rise of arch, as earlier noted, is approximately 3 microns, corresponding to the original thickness of the photoresist. The curvature of the undersurface of the bridge is concave from contact to contact and in the region of each contact. A section of the bridge along the axis of the bridge is shown in FIG. 2G by the dotted lines. A cross section is shown at FIG. 2H taken through the contact region.

The bottom surface of the air bridge is largely replicated by the upper surface, since the evaporation tends to create equal thickness metallizations on surfaces normal to the source. If the surfaces are not normal to the source, i.e. tilted by an angle $\phi$ from normal, the deposition is reduced by a factor approximately proportional to the cosine $\phi$. For small angles there is a negligible effect. In the example, the angle of the photoresist at the contact strips 21, 22 is usually less than 30°, giving a variation in thickness of less than 14%. A typical variation in thickness is less than 10%.

Had one not hard baked the strip 30, the nearly vertical walls of the openings 28, 29, would collect only a small percentage of the evaporated material. Thus, electrical continuity would be uncertain and there would be a very significant variation in conductance.

The hard bake in reducing the slope of the photoresist near the contacts from a typical 85° to less than 30°, provides a very significant improvement in the uniformity of the thickness of the air bridge metallization near the contacts. One might add that around the opening 33, where electrical continuity between the metallization within the opening and that outside of the opening is to be avoided, one relies both on nearly vertical side walls, and the lip provided by the CEM layer 32 to insure that the separation is complete. When the outer metallization is stripped off, a clean break with the bridge metallization is produced, and stringers are completely avoided.

The design rules associated with the process set a minimum footprint of 5 microns by 5 microns and a minimum free span of 5 microns for the arch. In practice, longer spans are more common, through more than 100 microns. In the case of longer spans, the design rules dictate that the length of the free span of the arch never exceed four times the breadth of the span. These limitations insure appropriately curved configurations on the undersurface of the bridge, and appropriate strength. As earlier stated, the process creates arches with equal rise dimensions on the same wafer, and equal thickness at the spans. While a typical rise is 3 microns, it may be increased, using a thicker layer of photoresist. The thickness of the span may also be increased if the occasion demands, but 2 microns appear to provide a reasonable typical value.

The evaporation process, which has just been described, has fewer steps and significant advantages over other known processes, such as electroplating, as earler stated. The novel process entails the several steps depicted and, requires only a single metal deposition step. Electroplating by contrast is more labor intensive, requiring two metal depositions, and ion milling to remove unwanted base metal, and requires a processing time several times longer than the novel evaporation process herein described. Evaporation provides a more uniform metal thickness, a higher purity metallization, excellent morphology and improved bondability over electroplating.

The wafer material may be of any semiconductor materials including Gallium Arsenide, other III-V materials, silicon, or germanium. The bridge material of titanium gold is suitable for most semiconductor wafers. Aluminum may be used for silicon wafers.

What is claimed is:

1. The method of making an evaporated metallic air bridge on a semiconductor body between spaced contacts on an existing metallization, comprising the following steps:
   (1) photolithographically patterning a first uniform layer of photoresist coating said semiconductor body over said metallization to create two openings with steep sides at said two contacts with a photoresist strip of uniform thickness between said openings,
   (2) hard baking said photoresist strip to cause momentary softening to allow surface tension within said strip to reduce the slope of said openings at said contacts and create a gradually curving arcuate profile between contacts, said heating further polymerizing said photoresist for increased resistance to photoresist solvent and developer, and for reduced sensitivity to illumination,
   (3) photolithographically patterning a second layer of photoresist and a contrast enhancement layer coating said semiconductor body to create a third opening to expose said contacts and said hard baked strip of photoresist, the contrast enhancement layer creating a lip around said third opening to permit lift-off of unwanted portions of a second metal deposition outside said third opening,
   (4) forming a second metallization by evaporation over said semiconductor body, the deposition coating the exposed hard baked layer of photoresist and the exposed contact regions within said third opening to form an arch and coating areas surrounding said third opening, and
   (5) dissolving said second photoresist layer, the hard baked first layer of photoresist, and lifting off the portions of second metallization surrounding said third opening to form an air bridge.

* * * * *